455-619
2/22/83

United States Patent [19]
Voll

[11]  4,375,106
[45]  Feb. 22, 1983

[54] REMOTE CONTROL CIRCUIT

[76] Inventor: Walter Voll, Nikolaus-Fey-Strasse 2, Hassfurt 8728, Fed. Rep. of Germany

[21] Appl. No.: 215,467

[22] Filed: Dec. 11, 1980

[30] Foreign Application Priority Data

Dec. 22, 1979 [DE] Fed. Rep. of Germany ....... 2951974
Dec. 22, 1979 [DE] Fed. Rep. of Germany ....... 2951975
Dec. 22, 1979 [DE] Fed. Rep. of Germany ....... 2951976

[51] Int. Cl.³ ............................................. H04B 9/00
[52] U.S. Cl. ................................. 455/603; 488/618; 358/194.1; 358/210
[58] Field of Search ................ 488/603, 618; 358/210, 358/194.1; 331/113 R, 111; 340/825.63, 825.69, 825.57, 825.64, 825.72; 375/22, 23; 329/106; 332/3, 110

[56] References Cited

U.S. PATENT DOCUMENTS

| | | | |
|---|---|---|---|
| 3,392,374 | 7/1968 | Grace | 340/825.63 |
| 3,534,351 | 10/1970 | Harnden, Jr. et al. | 340/630 |
| 3,705,363 | 12/1972 | Okada et al. | 358/194.1 |
| 3,718,909 | 2/1973 | Greatbatch | 329/106 |
| 3,949,322 | 4/1976 | Morita | 358/194.1 |
| 4,156,810 | 5/1979 | Igarashi | 455/603 |
| 4,241,456 | 12/1980 | Nakagaki et al. | 358/194.1 |

*Primary Examiner*—Benedict V. Safourek
*Assistant Examiner*—Edward L. Coles
*Attorney, Agent, or Firm*—Sughrue, Mion, Zinn, Macpeak and Seas

[57] ABSTRACT

A remote control circuit for the control of one or more functions of a device, for example a toy or transparency projector, comprises a transmitter for transmitting control signal pulses and a receiver for evaluating the transmitted pulses, the design of the transmitter being such that the number of its components and its consumption of current are minimized. The transmitter accordingly comprises a monostable multivibrator with two complementary transistors. The collector of the first transistor is connected to the base of the second transistor, and the collector of the second transistor is connected to a signal pulse transmitting component, for example an infrared diode, and through a resistance-capacitance coupling to the base of the first transistor. Also connected to the base of the first transistor is a number of components determining different pulse intervals and corresponding in number to the functions to be controlled. The components can be individually switched in by respective switches. The receiver comprises a resistor-capacitor charging-circuit adapted to provide a saw-tooth voltage dependent on the pulse intervals and a voltage level detecting stage for detecting different voltage levels and selectively controlling the functions in dependence on detected levels.

10 Claims, 10 Drawing Figures

REMOTE CONTROL CIRCUIT

BACKGROUND OF THE INVENTION

The present invention relates to a remote control circuit, especially an infrared remote control circuit, for the control of one or more functions of a device, for example a toy vehicle or transparencies projector.

An infrared remote control circuit, by means of which several functions can be controlled, is described in the publication "Siemens, Technische Mitteilung aus dem Bereich des Bauelemente, Tonübertragung und Fernsteuerverfahren mit Infrarot," pages 19 to 21. Pulse code modulation is employed in this remote control circuit and a total of thirty different commands can be generated. However, a remote control circuit of that kind is expensive in spite of the use of integrated circuitry and therefore can be used only in high cost devices, for example television receivers.

A remote infrared light switch for remote control of a garage door is described in the journal ELD 1979, volume 12, pages 80 to 83. The transmitter circuit of the switch operates with an astable multivibrator, which can be switched over between two frequencies. A Darlington amplifier is provided for generation of the transmitted pulses. A further switch, by means of which the supply voltage can be placed in readiness for a short time, is provided in the transmitter. The receiver circuit incorporates a band pass filter and further components. This remote control circuit is expensive and its possibilities of use are restricted.

A single channel infrared remote control is described in the journal "Bauteile Report 17" (1979, volume 5, pages 189 to 191). The transmitter in this case operates with an oscillator composed of NAND-gates and a Darlington amplifier. Received pulses are integrated in the receiver until a certain threshold voltage is exceeded. Even with this supposedly simple circuit, a relatively large number of electronic components is still necessary.

In devices in which only a few, for example one to ten functions are to be controlled, it is desirable to achieve remote switching of these functions by means of a remote control circuit which is as of economical construction as possible.

SUMMARY OF THE INVENTION

It is the primary object of the present invention to provide a remote control circuit which in its construction is essentially optimised in respect of necessary components, operates with a simple coding, and has a low current consumption, particularly in the transmitter.

Other objects and advantages of the invention will be apparent from the following description.

According to the present invention there is provided a remote control circuit for controlling one or more functions in a device, said circuit comprising a transmitter for transmitting control signal pulses and a receiver for receiving and evaluating said pulses, wherein the transmitter comprises a monostable multivibrator for generating a cyclically repetitive train of pulses at determinable intervals and comprising two complementary transistors and a resistive-capacitive coupling, the collector of a first one of said transistors being connected to the base of the second one of said transistors and the collector of said second transistor being coupled to the base of said first transistor by way of said resistive-capacitive coupling; switching means; pulse interval determining means for determining different pulse intervals for said train and corresponding in number to the number of said functions and controllable by said switching means to cause a control signal pulse transmission of the transmitter to have a selected one of said intervals; and signal pulse transmitting means connected to the collector of said second transistor to provide a control signal pulse transmission with the selected pulse intervals; and wherein the receiver comprises signal pulse receiving means for receiving signal pulse transmissions from said signal pulse transmitting means; a resistor-capacitor charging circuit in which the capacitor is so chargeable via the resistor and dischargeable by each pulse of a received signal pulse transmission as to provide an output sawtooth voltage having a peak magnitude dependent on the selected pulse interval; a filter stage connected to said resistor-capacitor charging circuit to filter said output voltage thereof; and a voltage level detecting stage connected to said filter stage to detect the level of the voltage filtered by said stage and to control a respective function of said device which is associated with the detected voltage level.

A remote control circuit of this kind has numerous advantages, for example:

(a) The transmitted pulses can be very short by comparison with the pulse interval, for example the length of the transmitted pulses can be in the region of 10 to 50 microseconds. However, the current flowing through the transmitting component, such as an infrared diode, can be relatively high, for example 2.5 amps, as the power consumption of the transmitter is low due to the short current flow times and the fact that practically no current flows during the pulse intervals.

(b) Merely one component, for example a resistor for changing the keying ratio, and one switch, for example a keying switch, are necessary in the transmitter for the coding of each function to be controlled.

(c) In the transmitter, the multivibrator takes over the pulse generation as well as the amplifying function, so that these two tasks do not need to be carried out by individual component groups.

(d) The switches do not need to switch a high transmitting pulse current and it is therefore possible to use simple switches which are not in themselves suitable for switching high current.

(e) Due to the coding of the functions to be switched by the pulse intervals, the current consumption in the transmitter is not greatly affected, notwithstanding the control of several functions. Rather, pulse sequences with longer pulse intervals have a lower current consumption.

(f) The receiver is able to satisfactorily evaluate even those pulse sequences with a very small duty cycle, for example in which the pulse length is 30 microseconds and the pulse interval about 3 milliseconds, as the pulses are not integrated but rather every pulse interrupts the charging process, effected according to an exponential function, of the capacitor of the resistor-capacitor charging circuit. The sawtooth output voltage of the capacitor is simple to filter, while the output voltage of the filter stage can be evaluated by a commercially available type of voltage level detecting stage.

In a preferred embodiment of the invention, the pulse interval determining means comprises resistors which are connected in parallel to the base of the first transistor and with which switches of the switching means are connected in series. In that case, the resistors can be of high value, i.e. in the MegOhmn range. This has the advantage that the switches need be designed for switching only a very low current. In addition, a very small capacitor, for example 10 nano-Farads, can be used in the resistive-capacitive coupling in the multivibrator of the transmitter.

BRIEF DESCRIPTION OF THE DRAWINGS

Embodiments of the present invention will now be more particularly described by way of example and with reference to the accompanying drawings, in which.

DESCRIPTION OF THE PREFERRED EMBODIMENTS

Figure 1:
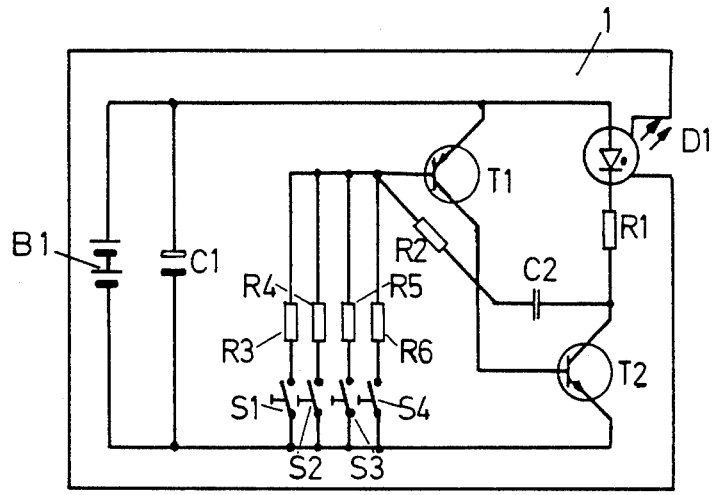
FIG. 1 is a circuit diagram of a transmitter of a remote control circuit according to a first embodiment of the invention, the circuit serving for the control of a plurality of functions in a device.

The components of the circuit shown in FIG. 1 are accommodated in a conveniently sized housing 1. A battery B1, for example a 9 volt battery, is located in the housing 1. Four key switches S1, S2, S3 and S4 are arranged on the housing 1. The housing 1 also includes an opening through which an infrared diode D1 can radiate pulses.

A capacitor C1, which delivers high current peaks, is connected in parallel with the battery B1. Connected to the poles of the battery B1 are the emitters of two complementary transistors T1 and T2. The collector of the transistor T1 is connected directly (c.f. FIG. 1) or through a resistor with the base of the transistor T2. The infrared diode D1 is connected through a series resistor R1 to the collector of the transistor T2. The collector of the transistor T2 is also connected through a capacitor C2 and a resistor R2 with the base of the transistor T1. The key switches S1 to S4 are connected to the base of the transistor T1 through resistors R3 to R6, which have different resistance values.

The resistance values of the resistors R3 to R6 lie in, for example, the MegOhm range, while that of the resistor R2 lies in, for example, the kilo-Ohm range. The capacitance of the capacitor C2 may be in the region of 10 nano-Farads.

In operation, when one of the key switches S1 to S4 is actuated, a base current flows through the transistor T1 and through the corresponding one of the resistors R3 to R6. A current amplified in correspondence with the amplification factor of the transistor T1 thereby flows through the base of the transistor T2 and the transistor T2 switches. As a result, a feedback takes place through the capacitor C2 and the resistor R2 to the base of the transistor T1 so that this switches through instantly. At the same time, a high current, for example in the order of 1 to 2.5 amps, flows through the resistor R1 and the infrared diode D1 to cause the diode to provide an output infrared light pulse. As soon as the capacitor C2 is charged, the current flowing through the resistor R2 drops, with the result that the current flowing through the resistor R1 and the diode D1 so reduces that the output infrared light pulse of the diode D1 terminates. Both transistors T1 and T2 are blocked. The duration of the current pulse flowing through the luminescent diode D1 is in the region of 10 to 50 microseconds. Accordingly, it is to be presumed that the manually actuated key switch is still closed after termination of the first transmitted pulse of the diode D1. The capacitor C2 is now discharged through the respective one of the resistors R3 to R6 connected in series with the closed one of the switches S1 to S4. The pulse interval is determined by the duration of this discharging process.

If it is assumed that the relevant switch S1 to S4 is closed for longer than the discharge of the capacitor C2 takes through the associated resistor R3 to R6, then the next switching of the transistors T1 and T2 occurs after the discharge of the capacitor C2. In the case of a switch S1 to S4 closed for a longer period of time, for example 1 second, the resistance value of the associated one of the resistors R3 to R6 thereby determines the duration of the pulse interval between two transmitted pulses.

Figure 2:
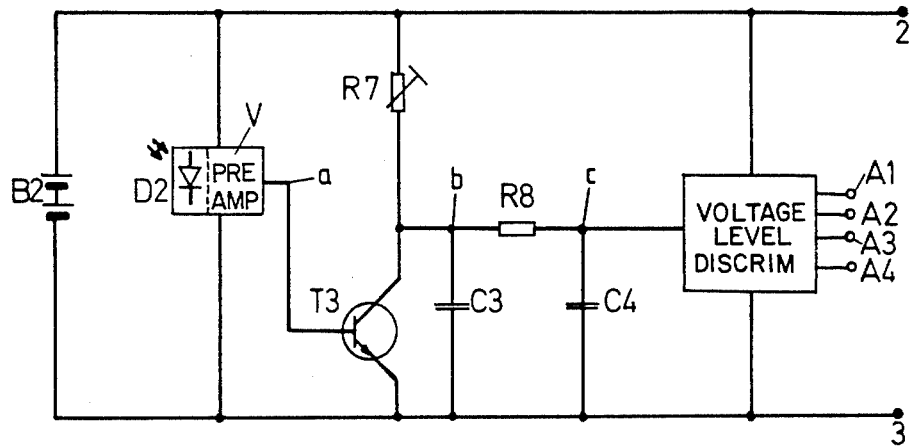
FIG. 2 is a circuit diagram of a receiver for the transmitter of FIG. 1, FIGS. 3(a)-(c) are voltage diagrams of the receiver of FIG. 2 for one pulse interval.

The receiver circuit illustrated in FIG. 2 is accommodated in the device to be remotely controlled. When this device is battery-operated, for example a toy car, then a battery B2 is included to provide the driving power for the device. In the case of a mains-operated projector for transparencies, an appropriate rectifier can be provided in place of the battery.

As already mentioned, the infrared pulses emitted by the infrared diode D1 have different pulse intervals according to whether the switch S1, S2, S3 or S4 was actuated. The receiver circuit according to FIG. 2 includes an infrared receiving diode D2, which is connected to a preamplifier V. The pre-amplifier V provides at its output a pulse sequence which is similar to the pulse output of the infrared diode D1 with respect to the pulse intervals of this output.

The output of the pre-amplifier V is applied to the base of a transistor T3. The collector-emitter path of the transistor T3 is connected in parallel with the capacitor C3 of a resistor-capacitor (RC) charging circuit R7 and C3, which is connected in parallel with the battery B2.

A filter circuit, consisting of a resistor R8 and a capacitor C4, is connected to the tap between the capacitor C3 and the resistor R7. The output of the filter circuit is applied to a voltage level discriminating or evaluating stage, which can be for example, an integrated component UAA 170 (Siemens). When four resistors R3 to R6 or switches S1 to S4 are provided in the transmitter, then the voltage level evaluating stage used is accordingly capable of evaluating four different voltage levels at its input and switching one of four outputs A1 to A4.

The driving circuit, which is known and therefore not illustrated, of the device to be controlled is connected to the poles 2 and 3 of the receiver circuit according to FIG. 2.

In operation of the receiver of FIG. 2, when the infrared diode D2 receives pulses from the diode D1 of the transmitter of FIG. 1, the transistor T3 is switched to be conductive during each of the pulses. Transmitted and received pulses of different pulse intervals are illustrated in FIGS. 3a and 4a. When the transistor T3 is switched to be conductive, it discharges the capacitor C3. Thereafter, the capacitor C3 is again charged up from the battery B2 via the resistor R7, the charging taking place according to an exponential function. The resistor R7 and the capacitor C3 are so dimensioned that the capacitor C3 is always only partially charged within the scope of the pulse sequence to be expected from the transmitter, so that the capacitor C3 is discharged again during a succeeding pulse. A sawtooth voltage thereby arises at the tap, as shown in FIGS. 3b and 4b for the two different pulse intervals. The duration of the charging process of the capacitor C3 and thereby the amplitude of the sawtooth voltage depend on the pulse intervals. The sawtooth voltage at the tap is filtered by means of the resistor R8 and the capacitor C4 so that a unidirectional voltage with little residual wavyness occurs at the input of the voltage level evaluating stage, as shown in FIGS. 3c and 4c. The magnitude of the unidirection voltage depends on the sawtooth voltage at the tap and thereby on the pulse intervals of the transmitting diode D1. In dependence on the particular voltage value at the input of the voltage level evaluating stage, a corresponding one of the outputs A1 to A4 is switched and thereby controls the corresponding function of the device. When, for example, four functions are to be controlled in a remotely controlled toy vehicle, the functions concerned may be steering deflection to the right and to the left and drive forwardly and rearwardly. When four functions are to be controlled in a transparency projector, then the functions may be, for example, forward transport and reverse transport and feed of the optical system of the projector to, and return of the system from, the focussed setting.

Numerous further embodiments are within the scope of the invention. Thus, for example, it is possible to construct the transmitter according to FIG. 5. In the transmitter according to FIG. 5, series-connected resistors R9 to R12 are provided in place of the parallelly-connected resistors R3 to R6 according to FIG. 1. The switches S1 to S4 are each connected between a pole of the battery and a respective one of the resistors. When, for example, the switch S1 is closed, the duration of the pulse interval and thereby the duty cycle depends on the sum of the resistors R9 to R12. When the switch S4 is closed, the duration of the pulse interval depends solely on the resistor R9. The same applies for the other switches. It is advantageous in this arrangement that the switch respectively lying farther to the right in FIG. 5 has precedence over the switches lying farther to the left so that when, for example, the switch S4 and one or more of the switches S1, S2 and S3 are closed at the same time, the resulting transmitted pulse sequence is determined solely by the resistor R9. By contrast, in the case of the parallel connection of the resistors R3 to R6 according to FIG. 1, when two or more of the switches are actuated at the same time, the resulting transmitted pulse sequence has a duty cycle which is determined by the values of the parallel-connected resistors of all of the closed switches. By a suitable dimensioning of the resistors R3 to R6 and corresponding design of the voltage level evaluating stage, it may be possible for the simultaneous actuation of two or more of the switches S1 to S4 to cause switching of one or more further functions of the device. With such a design, more functions can be controlled than switches S1 to S4 are provided. For example, six functions can be controlled by three switches and three resistors when the simultaneous actuation of two switches is envisaged. Seven functions can be controlled when the circuit is so designed that the closing of all three contacts leads to the control of a respective further function.

Figure 8:
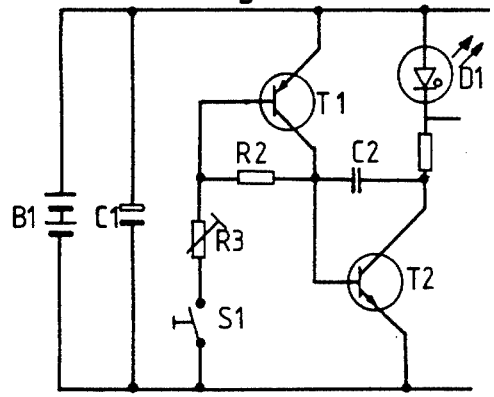
FIG. 8 is a circuit diagram of a codable transmitter of a remote control circuit according to a fourth embodiment of the invention, the circuit means serving for the control of one function.
Figure 9:
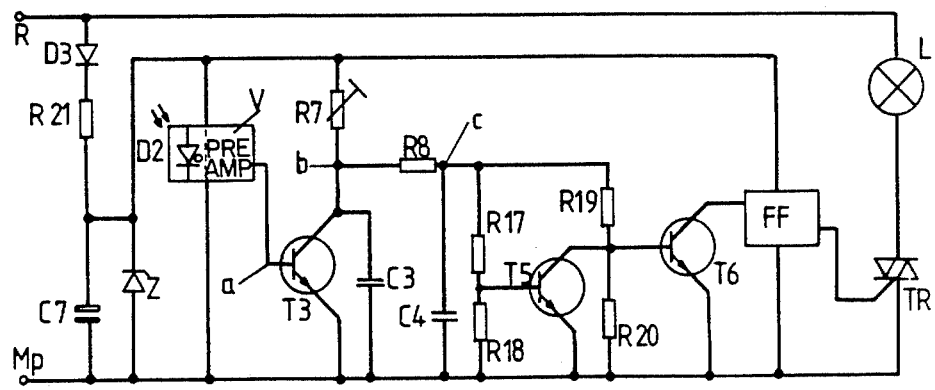
FIG. 9 is a circuit diagram of a codable receiver for the transmitter of FIG. 8.

The described remote control circuit can also be used when only one function is to be controlled. In this case, only one of the switches S1 to S4 is necessary (c.f. FIGS. 8 and 9).

For the setting of different pulse intervals, there can also be provided several parallel-connected or series-connected capacitors C2 which can be switched in by switches corresponding to the switches S1 to S4. In order to keep the current consumption low in this case, an on-off switch should be provided.

Figure 5:
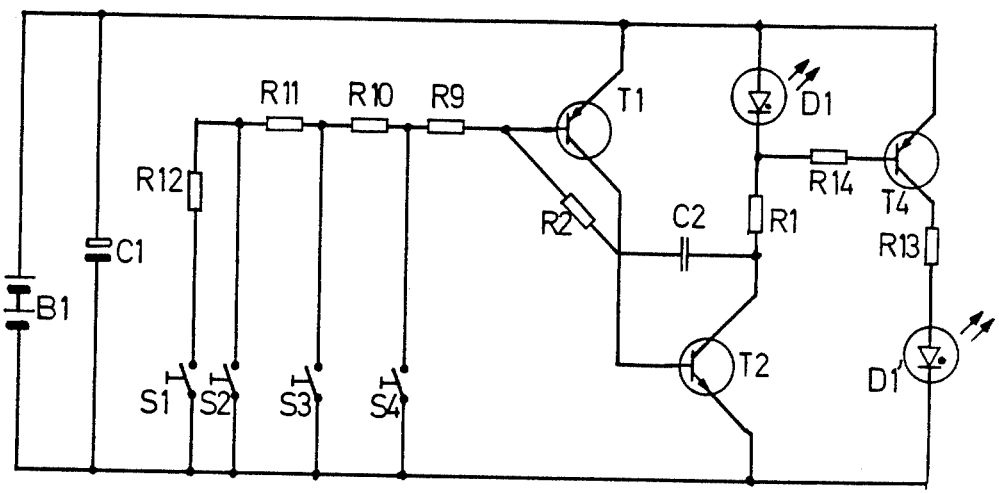
FIG. 5 is a circuit diagram of a transmitter of a remote control circuit according to a second embodiment of the invention.

Instead of just one transmitting diode D1, two or more transmitting diodes, connected in series or parallel, can be provided as shown in FIG. 5. If the voltage of the battery B1 is not high enough to operate transmitting diodes connected in series and the load capacity of the transistor T2 is not high enough to operate transmitting diodes connected in parallel, the second transmitting diode D1' is connected in series with a resistor R13 to the emitter-collector path of a further transistor T4, the base of which is connected via a resistor R14 with the first transmitting diode D1.

Within the scope of the invention, other transmitting and receiving components can also be used in place of the infrared transmitting diode circuits below 10 kiloHertz or high frequency oscillator circuits in the citizen band can be provided.

Figure 3:
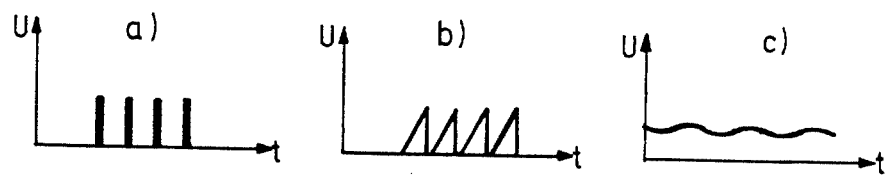
Figure 4:
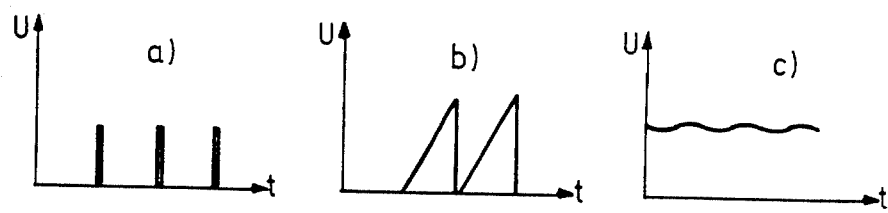
FIGS. 4(a)-(c) are voltage diagrams of the receiver of FIG. 2 for another pulse interval.
Figure 6:
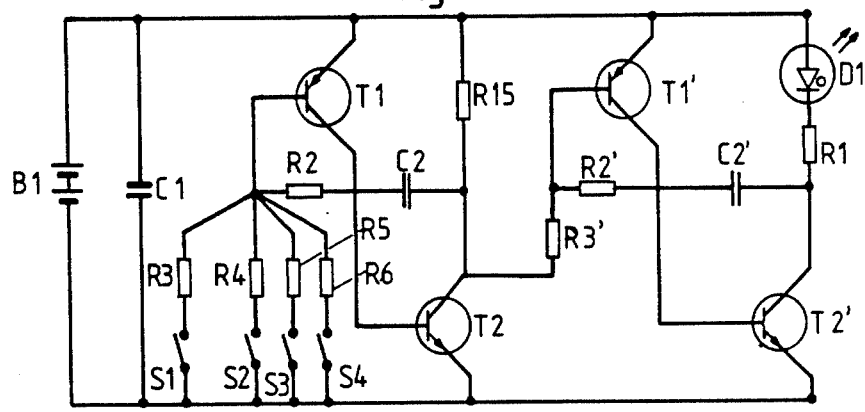
FIG. 6 is a circuit diagram of a transmitter of a remote control circuit according to a third embodiment of the invention.

Illustrated in FIG. 6 is a transmitter which generates not individual pulses according to FIG. 3, but discrete pulse trains. In principle, a further multivibrator is connected to the output of the first multivibrator of FIG. 1. The further multivibrator comprises two transistors T1' and T2', which correspond to the transistors T1 and T2 and an RC-coupling R2' and C2' which corresponds to the RC-coupling R2 and C2. A resistor R3' corresponds to the resistors R3, R4, R5 and R6. The switches S1 to S4 are connected in series with the resistors R3 to R6. A resistor R15 is connected between the collector of the transistor T2 and the battery B1. The dimensioning of the time constants of the charging and discharging processes of the capacitor C2' on the one hand and of the capacitor C2 on the other hand differ. The dimensioning of the capacitor C2, the resistor R2 and the resistors R3 to R6 is undertaken on the principles described with reference to the FIGS. 1 to 3, in particular so that the transistor T2 blocks substantially longer than it conducts. As long as the transistor T2 is switched through, the infrared diode D1 emits a pulse train. For this purpose, the time constants determined by the resistors R2' and R3' and the capacitor C2' are chosen to be correspondingly short. The pulse trains can have a duty cycle of about 1 with appropriate dimensioning of the resistor R3'. As a result, several pulses—a pulse train—appear between the pulse intervals in place of each individual pulse illustrated in FIG. 3a or FIG. 4a. By means of the circuit according to FIG. 6, it is thus possible to increase the number of the transmitted pulses between the pulse intervals.

Figure 7:
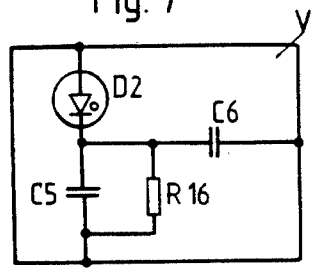
FIG. 7 is a circuit diagram of part of a receiver for the transmitter of FIG. 6.

In FIG. 7 there is shown an amplifier V which can be included in the receiving circuit according to FIG. 2. A filter in the form of a capacitor C5 and a resistor R16 is connected to the output of the receiving diode D2. The diode D2 is connected to the transistor T3 by a coupling capacitor C6. The filter composed of capacitor C5 and resistor R16 is tuned to the frequency of the pulse trains. Accordingly, a receiver having a filter set to a frequency other than that of the pulse train of a particular transmitter cannot respond to such pulse trains. It is thus possible to operate several receivers and several transmitters in close proximity but to have only one receiver responding to each transmitter. Moreover, improved insensitivity to interference and a greater operating range may be possible.

In FIG. 8 there is shown a transmitter circuit in which only one function is to be controlled. Accordingly, only one switch S1 and one resistor R3 are provided. The resistor R3 is arranged to be adjustable so that, according to the setting of the resistor, the transmitter can operate with different pulse intervals. A receiving circuit associated with the transmitter of FIG. 8 is shown in FIG. 9. The circuit components which correspond in construction and operation to the circuit components described with reference to FIG. 2 are provided with the same reference symbols. Connected to the output of the resistor R8 is a voltage level evaluating stage which consists of two parallel voltage dividers in the form of a first pair of resistors R17 and R18 and a second pair of resistors R19 and R20, as well as two transistors T5 and T6. The base-emitter path of the transistor T5 is connected in parallel to the resistor R18 and the base-emitter path of the transistor T6 in parallel to the resistor R20. The collector of the transistor T5 is connected to the base of the transistor T6 and forms the circuit output.

Figure 10:
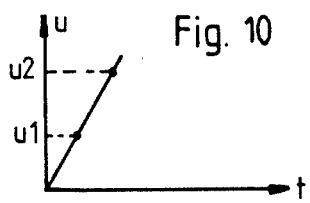
FIG. 10 is a voltage diagram for the receiver of FIG. 9.

This circuit operates as a window discriminator (amplitude filter) and its characteristic is shown in FIG. 10. When the voltage at point c (c.f. FIG. 3c or 4c) lies between the values U1 and U2, the transistor T6 is disposed in the one of its switching states. Above and below the values U1 and U2, the transistor T6 is disposed in its other switching state. The resistor R7 is settable. It is so set that the voltage level following reception of the pulse sequence of the associated transmitter (c.f. FIG. 8) reaches a value between U1 and U2. It is thereby possible to operate several of the receiving circuits according to FIG. 9 with several of the transmitters according to FIG. 8 in close proximity but with one transmitter controlling one receiving circuit and another transmitter another receiving circuit. It is also possible to associate groups of transmitters with one receiving circuit or to associate one group of receiving circuits with one transmitter.

In the embodiment according to FIG. 9, there is shown an instance in which a drive circuit FF, which comprises a flipflop controlling triac TR, is connected downstream of the transistor T6. The triac TR is connected in series with a light source L, which is connected to electrical mains poles R and Mp. In this case, on initial actuation of the transmitter of FIG. 8, which is disposed within the space within which the light source L is installed, the light source is switched on. On repeated actuation of the transmitter, the light source L switches off. When as in this case the component to be switches is connected to electrical mains, it is recommended to derive the supply voltage for the receiver circuit from the mains. For this purpose, a rectifier diode D3, a series resistor R21 and a filter capacitor C7 are provided in the embodiment of FIG. 9. Connected in parallel thereto is a Zener diode Z for voltage stabilization.

The refinements described for the transmitting circuit on the one hand and the receiving circuit on the other hand can also be included in further embodiments.

I claim:

1. A remote control circuit for controlling one or more functions in a device, said circuit comprising a transmitter for transmitting control signal pulses and a receiver for receiving and evaluating said pulses, wherein the transmitter comprises
   (a) a monostable multivibrator for generating a cyclically repetitive train of pulses at determinable intervals and comprising two complementary transistors and a resistive-capacitive coupling, the collector of a first one of said of transistors being connected to the base of the second one of said transistors and the collector of said second transistor being coupled to the base of said first transistor by way of said resistive-capacitive coupling;
   (b) switching means;
   (c) pulse interval determining means for determining different pulse intervals for said train and corresponding in number to the number of said functions and controllable by said switching means to cause a control signal pulse transmission of the transmitter to have a selected one of said intervals; and
   (d) signal pulse transmitting means connected to the collector of said second transistor to provide a control signal pulse transmission with the selected pulse interval; and
wherein the receiver comprises
   (a) signal pulse receiving means for receiving signal pulse transmissions from said signal pulse transmitting means;
   (b) a resistor-capacitor charging circuit in which the capacitor is so chargeable via the resistor and dischargeable by each pulse of a received signal pulse transmission as to provide an output sawtooth voltage having a peak magnitude dependent on the selected pulse interval;
   (c) a filter stage connected to said resistor-capacitor charging circuit to filter said output voltage thereof; and
   (d) a voltage level detecting stage connected to said filter stage to detect the level of the voltage filtered by said stage and to control a respective function of said device which is associated with the detected voltage level.

2. A remote control circuit according to claim 1, wherein said pulse interval determining means of the transmitter comprises a plurality of components each determining a respective one of said pulse intervals.

3. A remote control circuit according to claim 2, wherein said components are resistors connected in parallel with the base of said first transistor and said switching means comprises a plurality of switches each connected in series with a respective one of said resistors.

4. A remote control circuit according to claim 2, wherein said components are resistors connected in series with the base of said first transistor and said switching means comprises a plurality of switches each connected between a respective one of said resistors and the emitter of said second transistor.

5. A remote control circuit according to claim 1, wherein said pulse interval determining means of the transmitter comprises a single resistor connected to the base of said first transistor and said voltage level detecting stage of the receiver comprises a window discriminator responsive to a voltage value between predetermined upper and lower values.

6. A remote control circuit according to claim 5, wherein at least one of said single resistor of said pulse interval determining means of the transmitter and said resistor of the resistor-capacitor charging circuit of the receiver is adjustable to provide different resistances.

7. A remote control circuit according to claim 1, wherein said signal pulse transmitting means comprises at least one infrared diode.

8. A remote control circuit according to claim 7, wherein the transmitter further comprises a series resistor connected between the collector of said second transistor and said infrared diode or diodes.

9. A remote control circuit according to claim 1, wherein the receiver further comprises a pre-amplifier connected to said signal pulse receiving means to amplify said received signal pulse transmission, and a transistor connected at its base to the output of the pre-amplifier and having its collector-emitter path connected in parallel with said capacitor of said resistor-capacitor charging circuit.

10. A remote control circuit according to claim 1, wherein the transmitter comprises a coupling resistor and a further such monostable multivibrator, which comprises a first transistor having its base connected through said coupling resistor to the collector of said second transistor of the first said multivibrator and a second transistor having its collector connected to said signal pulse transmitting means, said further multivibrator being adapted to provide signal pulse intervals which are shorter than the selected pulse intervals at the first said multivibrator, and wherein the receiver comprises a further filter stage which is tuned to the pulse frequency of said further multivibrator.

* * * * *